United States Patent
Aleksov

(10) Patent No.: US 10,269,942 B2
(45) Date of Patent: Apr. 23, 2019

(54) COMPLEMENTARY TUNNELING FET DEVICES AND METHOD FOR FORMING THE SAME

(71) Applicant: Intel Corporation, Santa Clara, CA (US)

(72) Inventor: Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/673,359

(22) Filed: Aug. 9, 2017

(65) Prior Publication Data

US 2017/0365694 A1    Dec. 21, 2017

Related U.S. Application Data

(62) Division of application No. 15/036,058, filed as application No. PCT/US2013/077873 on Dec. 26, 2013, now Pat. No. 9,786,769.

(51) Int. Cl.
*H01L 29/06* (2006.01)
*H01L 29/66* (2006.01)
(Continued)

(52) U.S. Cl.
CPC ...... *H01L 29/66977* (2013.01); *H01L 29/068* (2013.01); *H01L 29/24* (2013.01);
(Continued)

(58) Field of Classification Search
CPC . H01L 29/42364; H01L 29/24; H01L 29/267; H01L 51/0038; H01L 51/0037;
(Continued)

(56) References Cited

U.S. PATENT DOCUMENTS 8,148,718 B2 *   4/2012   Asbeck ............... H01L 29/205
                                                      257/192
9,634,114 B2 *   4/2017   Fukui .................. B82Y 10/00
(Continued)

FOREIGN PATENT DOCUMENTS

CN          103094338         5/2013
WO     WO 2008/146157 A2     12/2008

OTHER PUBLICATIONS

Allowance Decision (4 pages) of Examination dated Feb. 18, 2017 issued by the Examiner of the Intellectual Property Office (the IPO) for Taiwan Patent Application No. 105119211.
(Continued)

*Primary Examiner* — Thinh T Nguyen
(74) *Attorney, Agent, or Firm* — Schwabe, Williamson & Wyatt, P.C.

(57) ABSTRACT

Described is an apparatus forming complementary tunneling field effect transistors (TFETs) using oxide and/or organic semiconductor material. One type of TFET comprises: a substrate; a doped first region, formed above the substrate, having p-type material selected from a group consisting of Group III-V, IV-IV, and IV of a periodic table; a doped second region, formed above the substrate, having transparent oxide n-type semiconductor material; and a gate stack coupled to the doped first and second regions. Another type of TFET comprises: a substrate; a doped first region, formed above the substrate, having p-type organic semiconductor material; a doped second region, formed above the substrate, having n-type oxide semiconductor material; and a gate stack coupled to the doped source and drain regions. In another example, TFET is made using organic only semiconductor materials for active regions.

7 Claims, 12 Drawing Sheets

(51) Int. Cl.
| | |
|---|---|
| *H01L 29/739* | (2006.01) |
| *H01L 29/267* | (2006.01) |
| *H01L 29/423* | (2006.01) |
| *H01L 51/05* | (2006.01) |
| *H01L 29/24* | (2006.01) |
| *H01L 29/786* | (2006.01) |
| *H01L 51/00* | (2006.01) |
| *H01L 21/8258* | (2006.01) |
| *H01L 29/78* | (2006.01) |

(52) U.S. Cl.
CPC ........ *H01L 29/267* (2013.01); *H01L 29/4238* (2013.01); *H01L 29/42364* (2013.01); *H01L 29/42376* (2013.01); *H01L 29/7391* (2013.01); *H01L 29/7869* (2013.01); *H01L 51/0036* (2013.01); *H01L 51/0037* (2013.01); *H01L 51/0038* (2013.01); *H01L 51/0078* (2013.01); *H01L 51/0533* (2013.01); *H01L 51/0554* (2013.01); *H01L 51/0562* (2013.01); *H01L 21/8258* (2013.01); *H01L 29/0673* (2013.01); *H01L 29/42392* (2013.01); *H01L 29/785* (2013.01); *H01L 29/7851* (2013.01)

(58) Field of Classification Search
CPC ............. H01L 51/0036; H01L 29/7869; H01L 51/562; H01L 51/554; H01L 290/7391; H01L 51/0533
USPC .... 257/40, 30, 642, 643, E39.007, E51.001; 438/82, 99
See application file for complete search history.

(56) References Cited

U.S. PATENT DOCUMENTS

| | | |
|---|---|---|
| 2006/0258072 A1 | 11/2006 | Kavalieros |
| 2007/0178650 A1 | 8/2007 | Chen et al. |
| 2009/0072270 A1* | 3/2009 | Asbeck ................ H01L 29/205 257/190 |
| 2010/0200916 A1* | 8/2010 | Gossner ................ H01L 29/083 257/335 |
| 2012/0074496 A1 | 3/2012 | Jalilizeinali et al. |
| 2012/0187376 A1* | 7/2012 | Tomioka ................ B82Y 10/00 257/24 |
| 2012/0193678 A1 | 8/2012 | Lauer et al. |
| 2012/0286350 A1 | 11/2012 | Doris |
| 2013/0334500 A1 | 12/2013 | Smets et al. |
| 2016/0204224 A1* | 7/2016 | Fukui .................... B82Y 10/00 438/198 |

OTHER PUBLICATIONS

Pinto, et al., "Rectifying junctions of tin oxide and poly(3-hexylthiophene) nanofibers fabricated via electrospinning," Applied Physics Letters, vol. 94, No. 8, XP012119243, Feb. 25, 2009, 3 pages.
European Extended Search Report for European Application No. 13 90 0285.1, dated Apr. 21, 2017, 10 pages.
European Communication pursuant to Rules 70(2) and 70a(2) EPC, a supplementary Search Report for European Application No. 13 90 0285.1, dated May 10, 2017, 1 page.
Office Action (including Search Report) dated Nov. 20, 2015 issued by the Examiner of the Intellectual Property Office (the IPO) for Taiwan Patent Application No. 103140822 (4 pages) and English Translation thereof (4 pages).
Allowance Decision of Examination dated May 18, 2016 issued by the Examiner of the Intellectual Property Office (the IPO) for Taiwan Patent Application No. 103140822, (2 pages).
Notification Concerning Transmittal of International Preliminary Report on Patentability dated Jul. 7, 2016 of the International Searching Authority for PCT/US2013/077873 filed Dec. 26, 2013, 8 pages.
Notice of Allowance and Fees for U.S. Appl. No. 15/036,058 dated May 17, 2017, 10 pages.
International Search Report of the International Searching Authority for PCT/US2013/077873 filed Dec. 26, 2013, 3 pages.
International Written Opinion of the International Searching Authority for PCT/US2013/077873 dated Jun. 26, 2016, 6 pages.
Office Action from Taiwan Patent Application No. 106109794 dated Sep. 22, 2017, 7 pages.
Office Action from German Patent Application No. I32651DE dated Oct. 5, 2017.
Office Action for European Patent Application No. 13900285.1 dated Dec. 21, 2017, 8 pgs.
2nd Office Action for Chinese Patent Application No. 201410858223.1 dated Oct. 23, 2017, 9 pgs.
Office Action from European Patent Application No. 13900285.1, dated Feb. 18, 2019, 8 pgs.

* cited by examiner

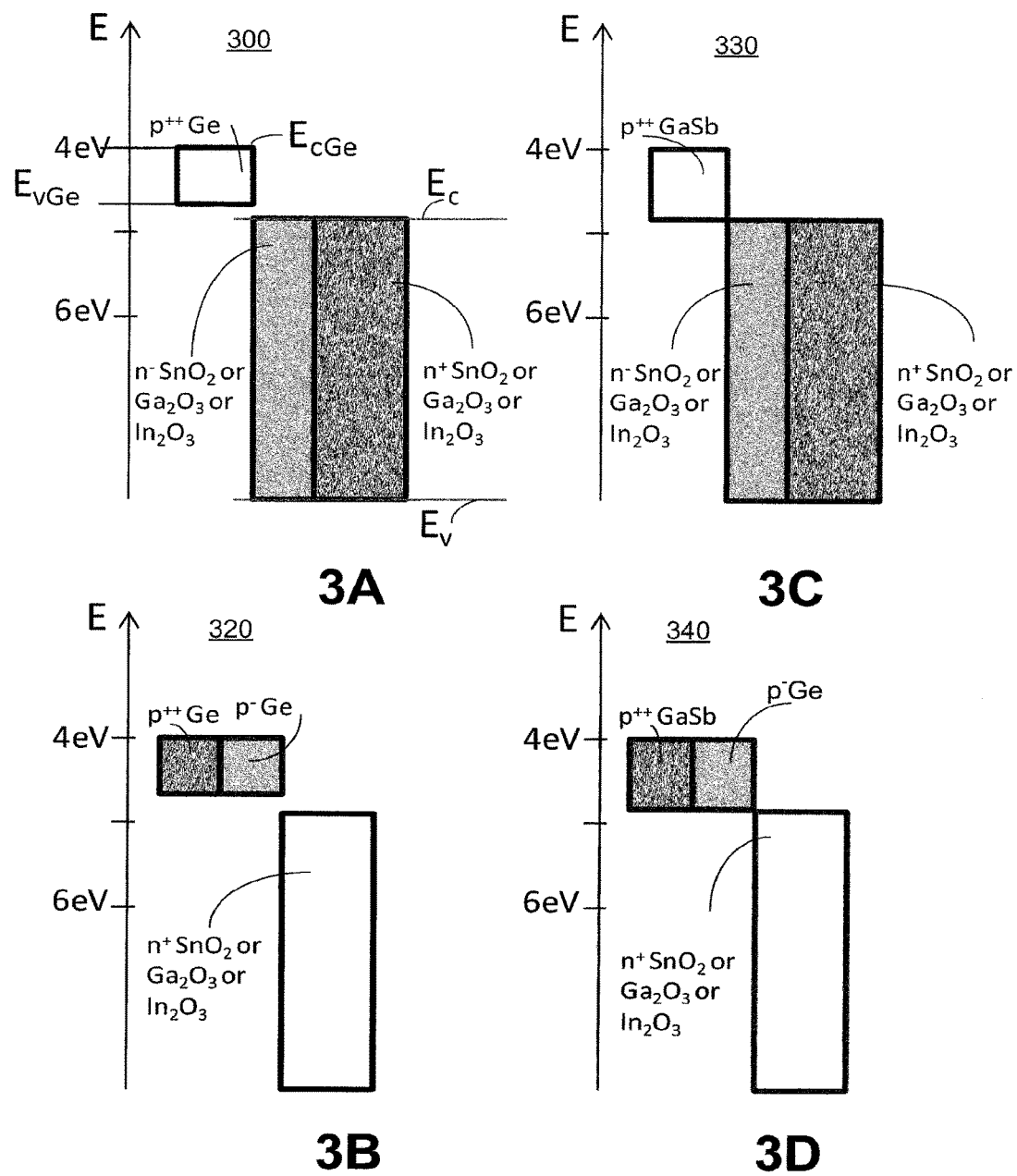
Figs. 3A-D

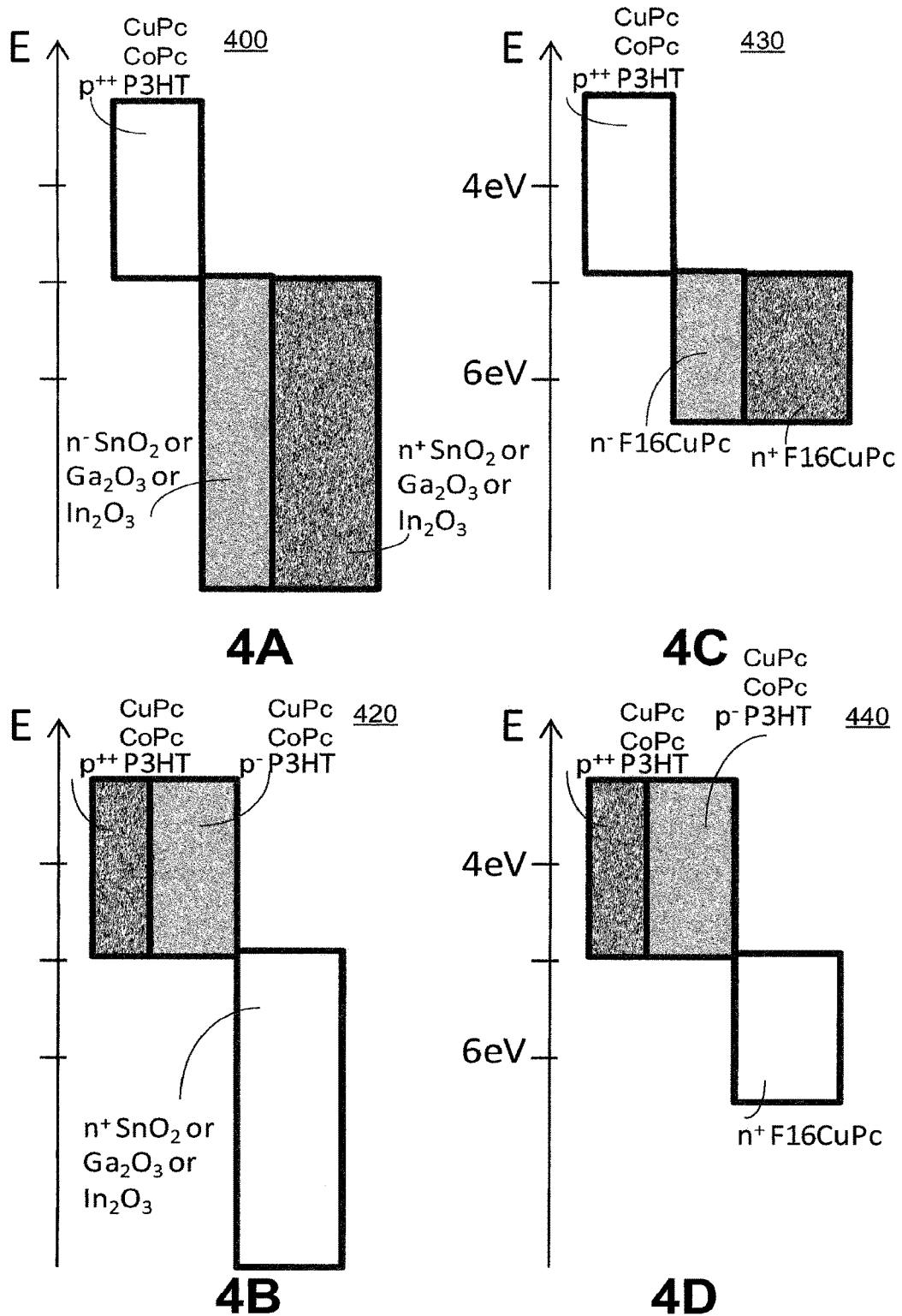
Figs. 4A-D

COMPLEMENTARY TUNNELING FET DEVICES AND METHOD FOR FORMING THE SAME

CLAIM OF PRIORITY

This application is a divisional application of U.S. patent application Ser. No. 15/036,058, filed May 11, 2016, which is a U.S. National Phase Application under 35 U.S.C. § 371 of International Application No. PCT/US2013/077873, filed Dec. 26, 2013, entitled "COMPLEMENTARY TUNNELING FET DEVICES AND METHOD FOR FORMING THE SAME," which designates the United States of America, the entire disclosure of which is hereby incorporated by reference in its entirety and for all purposes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. On bulk silicon substrates, however, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitic. Many different techniques have been attempted to reduce junction leakage of transistors. However, significant improvements are still needed in the area of junction leakage suppression.

Tunneling Field Effect Transistors (TFETs) are promising devices in that they promise significant performance increase due to a steeper sub-threshold slope. Currently the two materials used to manufacture a TFET device hetero-junction are GaSb (p-type) and InAs (n-type). The current TFET devices suffer from lower currents than Si-FETs at the same technology node and from a parasitic tunneling leakage current at pinch-off i.e., a reduced on/off ratio. The reason for this lies mainly in the low bandgap energy and the low conduction band density of states (CBDOS or $N_C$) of InAs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-D illustrate plots with band alignment for p-type and n-type TFETs using oxide semiconductor materials, according to one embodiment of the disclosure.

FIGS. 4A-D illustrate plots with band alignment for p-type and n-type TFETs using oxide and/or organic semiconductor materials, according to one embodiment of the disclosure.

DETAILED DESCRIPTION

Figure 1A:
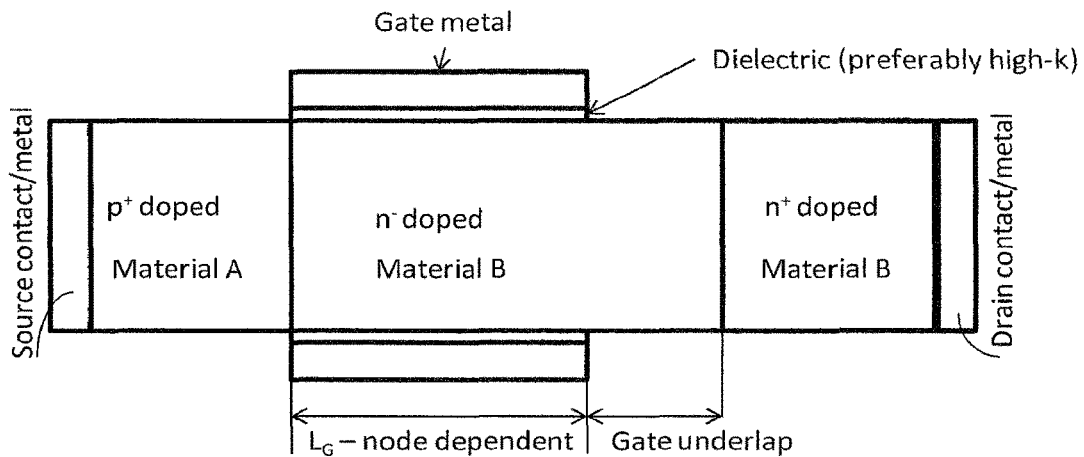
FIG. 1A illustrates a general TFET structure for n-type TFET.

The embodiments describe materials comprising the TFET junction that have a heterojunction with broken band alignment. Here, "broken band alignment" for n-TFET refers to gap between valance band energy of material used for source active region and conduction band energy of material used for channel region (the channel region is the semiconductor material of the gate-region including gate underlap). The channel and drain region material is usually the same (with different doping levels), however in general it can be comprised out of different materials according to various embodiments). The broken band (i.e., difference between one band to another band) can be greater or equal to zero (or just about zero). For p-TFET, the broken gap is the gap from the conduction band of the source region (which is n-doped) to the valence band of the channel region.

In one embodiment, the materials forming the heterojunction have a high effective valence band density of states (VBDOS or $N_V$) for the p-type and high effective conduction band density of states (CBDOS or $N_C$) for the n-type to obtain high currents comparable to or exceeding current Si-FETs. In one embodiment, the materials for forming TFETs have bandgaps that are wider than the potential difference created by the operating voltage ($V_{DD}$) to suppress unwanted leakage currents at pinch off.

The embodiments describe TFET structures (for n-TFET and p-TFET enabling C-TFET logic i.e., complementary TFET logic) with device performance substantially equal to or exceeding that of Si-FETs at the same technology node, while retaining or improving the sub-threshold slope and minimizing the off-state leakage current of the devices/circuit. Some embodiments describe forming TFETs using alternative materials i.e., groups of materials other than what are used today for forming TFETs (i.e., standard Group IV or IV-IV alloys or classical III-V materials). In one embodiment, transparent inorganic semiconductor oxide materials in combination with classic standard Group III-V, IV-IV, and IV materials are used for forming TFETs. In one embodiment, transparent inorganic semiconductor oxide materials in combination with organic semiconductor materials are used for forming TFETs. In one embodiment, only organic semiconductor materials are used for forming active regions of TFETs to alleviate aforementioned TFET device drawbacks.

The embodiments enable broken bandgap alignment for TFET devices. The embodiments exhibit high DOS (density of states) for high performance in the conduction and the valence bands (not necessarily in the same material) such that both high performance p-TFETs and n-TFETs enable complementary tunneling FET logic (C-TFET) with currents at higher levels than current TFETs. In one embodiment, the currents may well reach or exceed the current levels in Si-FETs at an identical technology node.

Some embodiments use materials with higher bandgaps to suppress off-state leakage currents. Such embodiments show superior leakage performance to current TFETs. Some embodiments enable such logic devices on different substrates than Si (such as but not limited to glass, polymers) and/or transparent devices (using electrodes made from transparent or semi/transparent material). For example, transparent semiconducting oxides and organic semiconductors can be combined to achieve transparent devices. In one embodiment, only organic semiconductors are used for forming the active regions of TFETs. Some embodiments describe methods for fabricating TFETs with low temperature processes which allow for making higher performance devices on flexible substrates. In such embodiments, higher performance flexible logic can be achieved that may become crucial for extending the computing continuum to the wearable and flexible electronic space.

Some of the embodiments, that describe use of low temperature manufacturing processes using an organic heterojunction and oxide semiconductor/organic heterojunction, may allow for vertically stacked devices to be manufactured. In such embodiments, significant reduction is achieved in the circuit footprint at the same technology node. The embodiments describe materials that exhibit more efficient gate control than traditional TFET materials because the described materials have a lower $\varepsilon_r$ than classical III-V semiconductors GaSb and InAs used in TFETs today. In one embodiment, organic semiconductors described have extremely low $\varepsilon_r$ of 2.5 to 3.5 which allow for better gate control for both n-TFET or p-TFET (with a $p^-$ or intrinsic control layer) as the voltage drop is divided between the gate dielectric and the gate-channel layer (i.e., the semiconductor).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors, TFETs, or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates a general TFET structure 100 for n-type TFET. Here, a TFET has a gate terminal formed from Gate metal over a dielectric material (e.g., high-K material). The dielectric material couples an intrinsic or lightly doped n-type active region formed of Material B. The minimum effective channel length under the gate (i.e., $L_G$) is process node dependent. On either side of the slightly doped n-type active region (i.e., $n^-$ doped) are $p^+$ doped active region forming the source region and $n^+$ doped active region forming the drain region. The $p^+$ doped region is formed of Material A while the $n^+$ doped region is formed of Material B. Metal contacts are coupled to each of the $p^+$ and $n^+$ doped regions to provide source and drain contacts, respectively. The $n^-$ doped active region under the Gate metal may overextend forming a Gate underlap as shown. Material C (different from Materials A and B) can also be used to form drain region which is n+ doped region.

In one embodiment, Material A is selected from the classic Group III-V, IV-IV, and IV (e.g., Ge, GaSb, etc.) while Material B is selected from transparent oxide semiconductors (e.g., α-$Ga_2O_3$, β-$Ga_2O_3$, $In_2O_3$, or $SnO_2$). In one embodiment, Material A is selected from organic semiconductors (e.g., P3HT, PCBM, PEDOT:PSS, CuPc, CoPc or other organic materials with a broken band alignment to the oxide semiconductors (i.e., valance band of these organic semiconductors is above (i.e., closer to vacuum level) the conduction band of the oxides), where P3HT is Poly(3-hexylthiophene-2,5-diyl); PCBM is Phenyl-C61-butyric acid methyl ester; PEDOT:PSS is poly(3,4-ethylenedioxythiophene) poly(styrenesulfonate), CuPc is Copper(II) phthalocyanine; CoPc is Cobalt phthalocyanine) In one embodiment, Material B is selected from transparent or semi-transparent oxide semiconductors (e.g., $Ga_2O_3$, $In_2O_3$, or $SnO_2$). In one embodiment, Material A is selected from organic semiconductors (e.g., p++ P3HT, PCBM, PEDOT: PSS, CuPc, CoPc, etc.,) while Material B is also selected from organic semiconductors (e.g., F16CuPc, $SnCl_2Pc$, etc., where F16CuPc is Copper hexadecafluoro phthalocyanine).

Figure 1B:
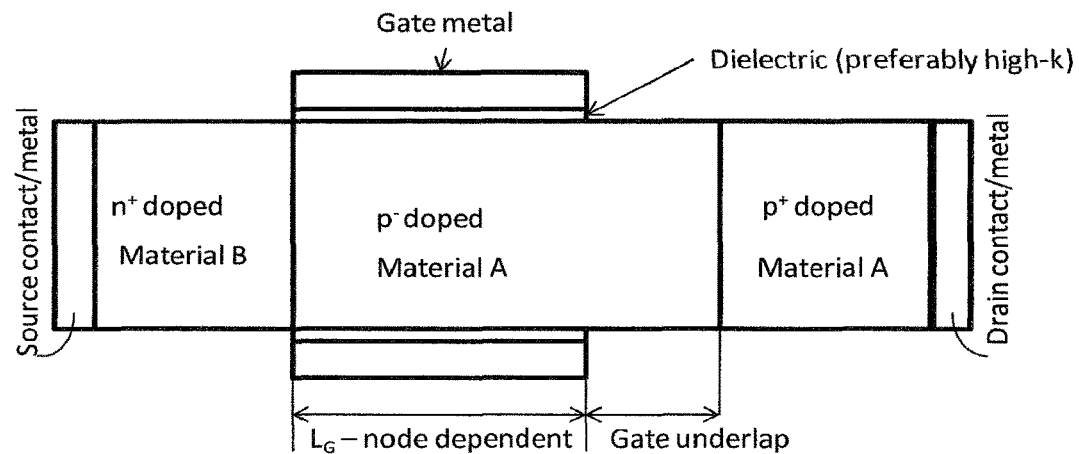
FIG. 1B illustrates a general TFET structure for p-type TFET.

FIG. 1B illustrates a general TFET structure 120 for p-type TFET. Here, a TFET has a gate terminal formed from Gate metal over a dielectric material (e.g., high-K material). The dielectric material couples a slightly doped p-type active region (i.e., p⁻ doped) formed of Material A. The minimum effective channel length under the gate (i.e., $L_G$) is process node dependent. On either side of the slightly doped p-type active region (i.e., p⁻ doped) are n⁺ doped active region forming the source region and p⁺ doped active region forming the drain region. The n⁺ doped region is formed of Material B while the p⁺ doped region is formed of Material A. Material C (different from Materials A and B) can also be used to form drain region which is n+ doped region. Materials A and B are described with reference to FIG. 1A. Referring back to FIG. 1B, metal contacts are coupled to each of the n⁺ and p⁺ doped regions to provide source and drain contacts respectively. The p⁻ doped active region under the Gate metal may overextend forming a Gate underlap as shown. In one embodiment, the TFET (n-TFET and/or p-TFET) is a FinFet, Tri-Gate, or square nano-wire based device.

Figure 2:
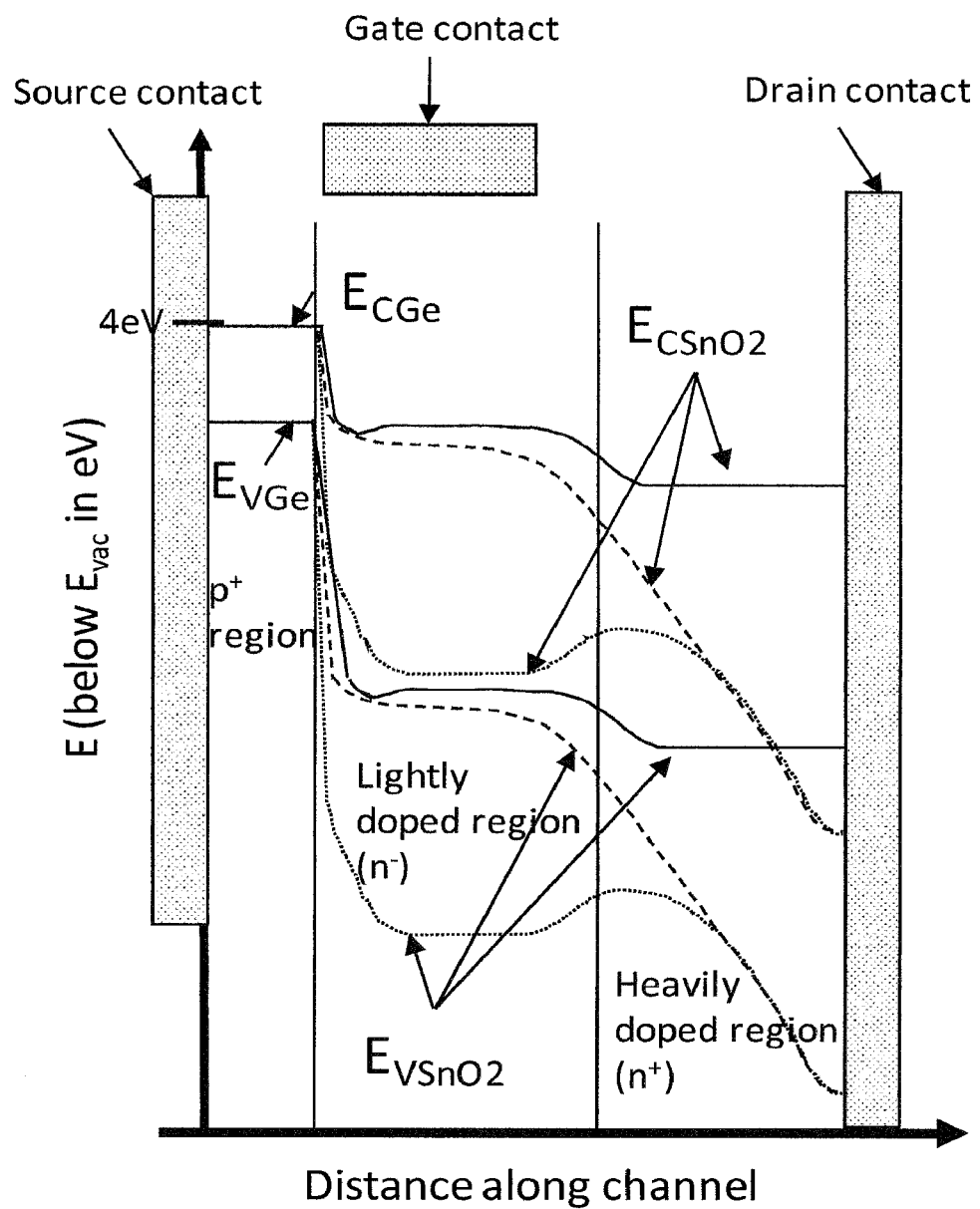
FIG. 2 illustrates a plot of band diagram for an n-TFET, according to one embodiment of the disclosure.

FIG. 2 illustrates a plot 200 showing band diagram for a TFET, according to one embodiment of the disclosure. It is pointed out that those elements of FIG. 2 having the same reference numbers (or names) as the elements of any other figure can operate or function in any manner similar to that described, but are not limited to such.

Here, x-axis is distance and y-axis is bandgap energy E in electron Volt (eV). Here, the numbers on the energy scale indicate distance from the vacuum level. The solid lines indicate band alignment without applied external voltage (i.e. neutral/off state). The dashed lines indicate band alignment when operating voltage to drain region is applied and when no voltage is applied to the gate region (i.e., off state). The dotted lines indicate band alignment when operating voltage is applied to both drain and gate regions (i.e., on state). Here, the solid, dashed, and dotted lines refer to the same device in different modes of operation.

The Plot 200 shows band alignment for a p-type TFET having a source region made from highly doped p-type (i.e., p⁺⁺ doped) Material A from classic Group III-V, IV-IV, and IV (e.g., Ge, GaSb). For p⁺⁺ doped Ge, energy for the conductance band (i.e., $E_{cGe}$) is about 4 eV while the energy for valance band (i.e., $E_{vGe}$) is lower than $E_{cGe}$ but higher than the energy for the conductance band of the drain region. In one embodiment, the drain region is made from highly doped n-type (i.e., n⁺ doped) transparent oxide semiconductor material (e.g., α-$Ga_2O_3$, β-$Ga_2O_3$, $In_2O_3$, or $SnO_2$). The energy of conductance band for $SnO_2$ (i.e., $E_{cSnO2}$) is lower (or equal i.e., borderline broken gap) than $E_{vGe}$ forming a broken bandgap. The region between the drain region and the source region is a lightly doped n-type region (i.e., n⁻) made from transparent oxide semiconductor material (e.g., α-$Ga_2O_3$, β-$Ga_2O_3$, $In_2O_3$, or $SnO_2$). The gate in a device like this would usually/ideally go all around the channel material/region (e.g., lightly doped part of Material B) or at least be contacting this region from one side. There will be a dielectric material (high-k or not) between gate metal and the channel material/region (i.e., the lightly doped region of Material B). In diagram 200, the gate is a placeholder showing where the gate spatially would be located along the X-Axis.

FIGS. 3A-D illustrate band alignments for p-type and n-type TFETs using oxide semiconductor materials, according to one embodiment of the disclosure. It is pointed out that those elements of FIGS. 3A-D having the same reference numbers (or names) as the elements of any other figure can operate or function in any manner similar to that described, but are not limited to such.

FIG. 3A illustrates a plot 300 showing band alignment for p-TFET, according to one embodiment. FIG. 3B illustrates a plot 320 showing band alignment for n-TFET, according to one embodiment. FIG. 3C illustrates a plot 330 showing band alignment for p-TFET, according to another embodiment. FIG. 3D illustrates a plot 340 showing band alignment for n-TFET, according to another embodiment. In the embodiments of FIGS. 3A-D, transparent oxide semiconductor materials are used for n-type material while classic Group III-V, IV-IV, and IV semiconductor materials are used for p-type materials. Here, the top of each box or rectangle representing the semiconductor material is the conduction band (CB) and the bottom of each box is the valance band (VB).

In one embodiment, traditional use of InAs for TFETs is replaced with transparent oxide semiconductor material. In one embodiment, the transparent oxide semiconductor materials are selected from a group comprising: β-$Ga_2O_3$, $In_2O_3$ or $SnO_2$. In one embodiment, β-$Ga_2O_3$ has a single conduction band minimum at Γ-point (i.e., gamma point). $N_C$ of β-$Ga_2O_3$ is approximately $5.7 \times 10^{18}$ cm⁻³ due to the high effective mass of about 0.34 $m_0$. This is about two orders of magnitude higher than $N_C$ of InAs. $\varepsilon_r$ of β-$Ga_2O_3$ is about 10, which is lower than $\varepsilon_r$ of InAs which is about 15.2. β-$Ga_2O_3$ has a wide bandgap of about 4.7 eV to 4.9 eV and a high breakdown field of about $8 \times 10^6$ V/cm. The electron affinity of β-$Ga_2O_3$ is in the range of 4.7 eV to 5.1 eV.

In one embodiment, direct bandgap of SnO2 is about 3.6 eV and its electron affinity is about 4.7 eV to 5.0 eV. The effective mass (i.e., DOS) of $SnO_2$ is about 0.275 $m_0$, yielding an $N_C$ of about $4.1 \times 10^{18}$ cm⁻³, which is lower than in β-$Ga_2O_3$, but still over one order of magnitude higher than in InAs. $SnO_2$ may have n-type doping concentrations as high as $2\text{-}8 \times 10^{20}$ cm⁻³.

With reference to p-TFET of FIG. 3A, the source region is formed from any one of highly doped classic Group III-V, IV-IV, and IV material (e.g., p⁺⁺ doped Ge), the drain region is formed from highly doped (i.e., n⁺ doped) transparent oxide semiconductor material (e.g., one of α-$Ga_2O_3$, β-$Ga_2O_3$, $SnO_2$, $In_2O_3$). The gate overlapping region is formed from slightly doped (i.e., n⁻ doped) n-type transparent oxide semiconductor material. With reference to n-TFET of FIG. 3B, the source region is formed from any one of highly doped classic Group III-V, IV-IV, and IV materials (e.g., $p^{++}$ doped Ge), the drain region is formed from highly doped (i.e., $n^+$ doped) transparent oxide semiconductor material (e.g., one of $\alpha$-$Ga_2O_3$, $\beta$-$Ga_2O_3$, $SnO_2$, $In_2O_3$). The gate overlapping region is formed from slightly doped (i.e., $p^-$ doped) p-type material from any one of classic Group III-V, IV-IV, and IV materials.

With reference to p-TFET of FIG. 3C, the source region is formed from any one of highly doped classic Group III-V, IV-IV, and IV material (e.g., $p^{++}$ doped GaSb), the drain region is formed from highly doped (i.e., $n^+$ doped) transparent oxide semiconductor material (e.g., one of $\alpha$-$Ga_2O_3$, $\beta$-$Ga_2O_3$, $GaGdO_x$, $SnO_2$, $In_2O_3$). The gate overlapping region is formed from slightly doped (i.e., $n^-$ doped) n-type transparent oxide semiconductor material. With reference to n-TFET of FIG. 3D, the source region is formed from any one of highly doped classic Group III-V, IV-IV, and IV material (e.g., $p^{++}$ doped GaSb), the drain region is formed from highly doped (i.e., $n^+$ doped) transparent oxide semiconductor material (e.g., one of $\alpha$-$Ga_2O_3$, $\beta$-$Ga_2O_3$, $GaGdO_x$, $SnO_2$, $In_2O_3$). The gate overlapping region is formed from slightly doped (i.e., $p^-$ doped) p-type material from any one of classic Group III-V, IV-IV, and IV material (e.g., $p^-$ doped Ge).

$Ga_2O_3$ i.e., $GaGdO_x$ where 'x' is an integer, is a dielectric to enable GaAs MOSFETs to achieve low interface density for a GaSb/$\beta$-$Ga_2O_3$ or GaSb/$\alpha$-$Ga_2O_3$ junction. In one example, $\alpha$-$Ga_2O_3$, or $\beta$-$Ga_2O_3$ acts like GaSb oxide. In one embodiment, interface state passivation methods are used to reduce or eliminate interface states at the transition from one material to the other material at the heterojunction interface. The valence band of GaSb is at about 4.9 eV which provides a GaSb/$\beta$-$Ga_2O_3$ p/n heterojunction with a broken bandgap with a break between the $p^-$ doped GaSb valance band and the $n^-$ doped $\beta$-$Ga_2O_3$ conduction band of up to 0.2 eV.

Figure 5A:
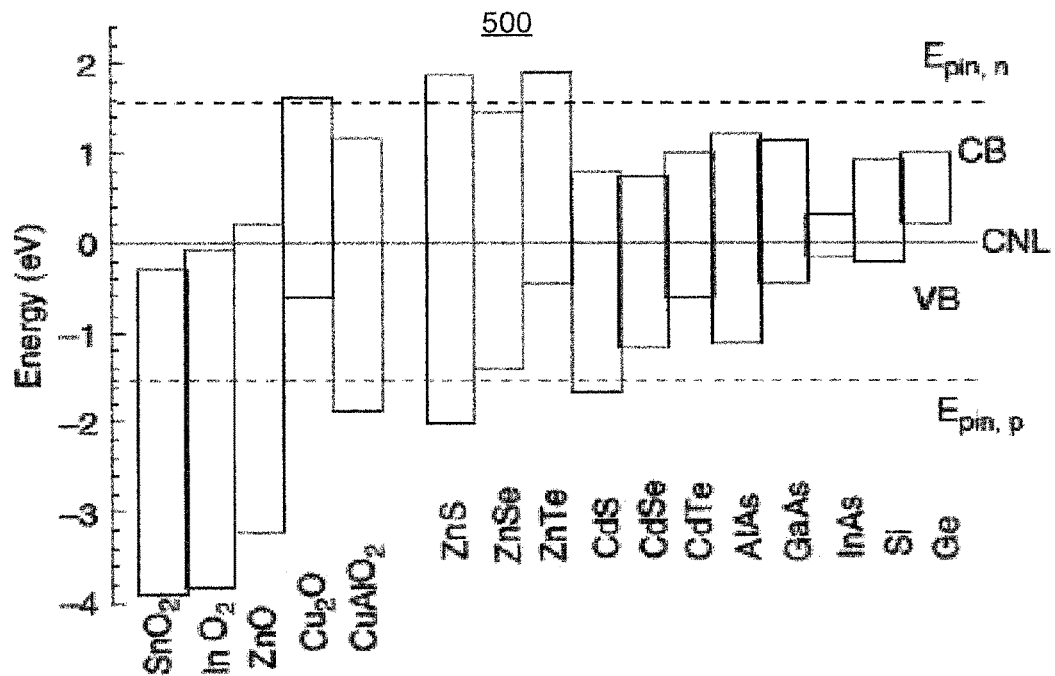
FIG. 5A illustrates band diagrams of oxides and comparative semiconductors aligned according to their charge neutrality levels.
Figure 5B:
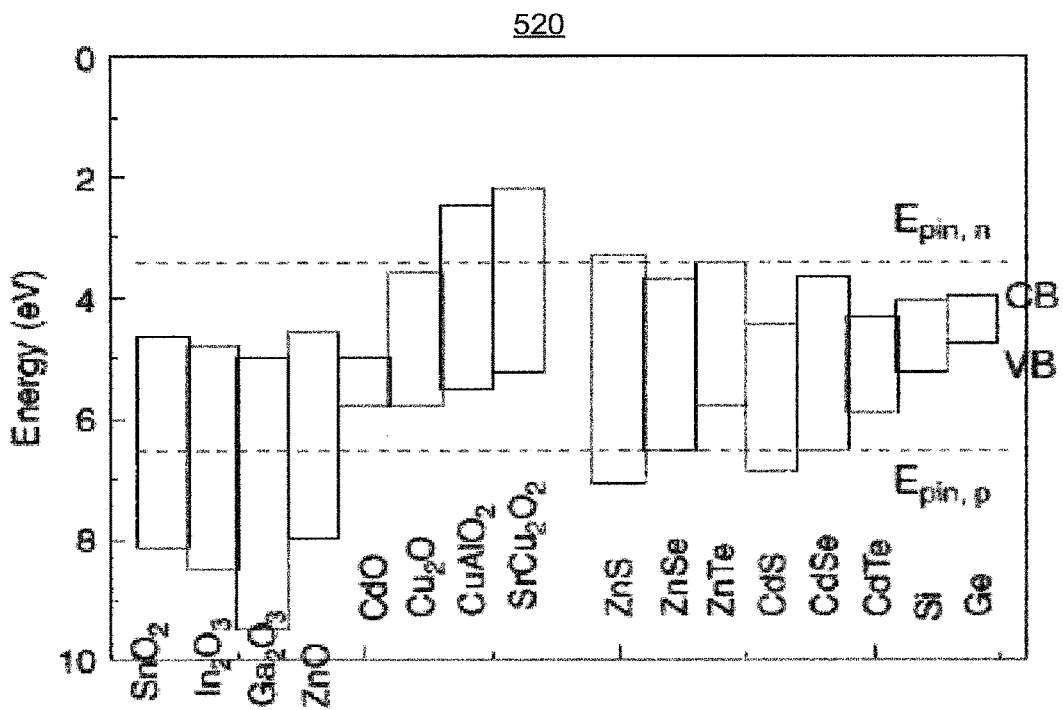
FIG. 5B illustrates band diagrams of oxides and comparative semiconductors aligned according to their vacuum levels.

In one embodiment, p-type doped Ge, SiGe, or Si is combined with n-type doped $SnO_2$ to form a TFET. Sn is a Group IV element and as such isoelectric to Ge and Si, and $SnO_2$ has a similar structure to $GeO_2$ and $SiO_2$. This electronic and structural similarity between Si, Ge, SiGe, and Sn on one side and $SiO_2$, $GeO_2$, and $SnO_2$ on the other is expected to allow for a low states heterojunction. The broken gap alignment yields a similar break as for GaSb/$\beta$-$Ga_2O_3$. FIGS. 5A-B illustrate plots for estimating band alignment for different material combinations.

FIGS. 4A-D illustrate plots of band alignment for p-type and n-type TFETs using oxide and/or organic semiconductor materials, according to one embodiment of the disclosure. It is pointed out that those elements of FIGS. 4A-D having the same reference numbers (or names) as the elements of any other figure can operate or function in any manner similar to that described, but are not limited to such.

FIG. 4A illustrates a plot 400 showing band alignment for p-TFET, according to one embodiment. FIG. 4B illustrates a plot 420 showing band alignment for n-TFET, according to one embodiment. FIG. 4C illustrates a plot 430 showing band alignment for p-TFET, according to another embodiment. FIG. 4D illustrates a plot 440 showing band alignment for n-TFET, according to another embodiment. In the embodiments of FIGS. 4A-B, transparent oxide semiconductor materials are used for n-type material while organic semiconductor materials are used for p-type materials. In the embodiments of FIGS. 4C-D, organic semiconductor materials are used for both p-type and n-type materials. Here, the top of each box or rectangle representing the semiconductor material is the conduction band (CB) and the bottom of each box is the valance band (VB).

With reference to p-TFET of FIG. 4A, the source region is formed from organic semiconductor material, the drain region is formed from highly doped (i.e., $n^+$ doped) transparent oxide semiconductor material (e.g., one of $\beta$-$Ga_2O_3$, $SnO_2$, $In_2O_3$). Examples of p-type organic semiconductor materials include P3HT, MDMO-PPV (i.e., Poly[2-methoxy-5-(3,7-dimethyloctyloxy)-1,4-phenylene-vinylene]), PEDOT:PSS, CuPc, CoPc. The HOMO energies are about 4.7 eV to 5.1 eV for P3HT, MDMO-PPV, and Pentacene. Here, the term "HOMO" refers to the highest occupied molecular orbital. For a molecule or a molecular crystal, such as organic materials, HOMO is equivalent to the Valence Band edge Ev. Here, the term "LUMO" refers to highest unoccupied molecular orbital. For a molecule or molecular crystal (such as these organic materials) LUMO is the equivalent of the conduction band edge Ec. The HOMO energies for PEDOT:PSS is about 5.0 eV to 5.3 eV. The band positions may be affected by deposition methods and post deposition treatment. P3HT, PEDOT:PSS can be heavily doped (i.e., PDOT:PSS hole concentrations greater than $3 \times 10^{20}$ $cm^{-3}$). The bandgap for P3HT and PEDOT:PSS is about 1.7 eV to 2.0 eV. $N_v$ of HOMO is well above several $10^{18}$ $cm^3$. In one embodiment, the gate region is formed from lightly doped (i.e., $n^-$ doped) n-type transparent oxide semiconductor material. Other organic material not listed here, but with suitable band alignments and doping properties, can also be utilized.

With reference to n-TFET of FIG. 4B, the source region is formed from p-type organic semiconductor material (e.g., one of $p^{++}$ doped P3HT, MDMO-PPV, PEDOT:PSS), the drain region is formed from highly doped (i.e., $n^+$ doped) transparent oxide semiconductor material (e.g., one of $\alpha$-$Ga_2O$, $\beta$-$Ga_2O_3$, $SnO_2$, $In_2O_3$). The gate overlapping region is formed from slightly doped (i.e., $p^-$ doped) p-type material from p-type organic semiconductor material. Other organic material not mentioned here, but with suitable band alignments and doping properties can also be utilized.

In one embodiment, in combination with oxide semiconductors the band alignment shows a broken gap between 0 eV to 0.3 eV with values around 0 eV to 0.1 eV when using PEDOT:PSS and higher with P3HT, CuPc, or CoPc. In one embodiment, undoped P3HT also serves as the $p^-$ material which can also be CoPc or CuPc. Other organic material not mentioned here, but with suitable band alignments and doping properties can also be utilized. In one embodiment, for organic semiconductor materials, adding a surface segregated organic monolayer allows tuning of the surface dipole and thus of the band alignment.

With reference to p-TFET of FIG. 4C, the source region is formed from organic semiconductor material (e.g., one of $p^{++}$ doped P3HT, MDMO-PPV, PEDOT:PSS), the drain region is formed from highly doped (i.e., $n^+$ doped) organic semiconductor material (e.g., F16CuPc, $SnCl_2Pc$, etc.). The gate overlapping region is formed from slightly doped (i.e., $n^-$ doped) n-type organic semiconductor material (e.g., F16CuPc, $SnCl_2Pc$, etc.). With reference to n-TFET of FIG. 4D, the source region is formed from any one of highly doped organic semiconductor material (e.g., one of $p^{++}$ doped P3HT, MDMO-PPV, PEDOT:PSS), the drain region is formed from highly doped (i.e., $n^+$ doped) organic semiconductor material (e.g., F16CuPc, $SnCl_2Pc$, etc.). The gate region is formed from slightly doped (i.e., $p^-$ doped) p-type material from organic semiconductor material (e.g., one of $p^{++}$ doped P3HT, MDMO-PPV, PEDOT:PSS).

Although many organic n-type materials have a very shallow LUMO with affinities to $E_{Vac}$ of 2.5 eV to 3.5 eV, in one embodiment, organic n-type semiconductors such as F16CuPc with LUMO of about 4.9 eV below $E_{Vac}$ form an excellent fit to the HOMO level e.g., of P3HT. Although mobility of organic materials is very low, in one embodiment, the intrinsic device performance may not be defined by it for TFETs provided the gate is within the length of the carrier wavelength and the gate underlap is shorter than that. In one embodiment, the heavily doped regions reduce parasitic resistance due to the high carrier concentrations of organic semiconductor material. For example, PDOT-PSS can have conductivities approaching those of ITO.

FIG. 5A illustrates a plot 500 with band diagrams of oxides and comparative semiconductors aligned according to their charge neutrality levels. It is pointed out that those elements of FIG. 5A having the same reference numbers (or names) as the elements of any other figure can operate or function in any manner similar to that described, but are not limited to such.

Here, on the x-axis, a number of semiconductors are listed according to their charge neutrality levels and their bandgap energies in eV are plotted on the y-axis. The top of each box representing the semiconductor oxide is the conduction band (CB) and the bottom of each box is the valance band (VB). The difference between CB and VB for each box is the bandgap energy for that semiconductor oxide. By choosing Ge for p-type source region and $SnO_2$ (transparent or semi-transparent semiconductor oxide) for n-type drain region, a broken gap of about 250 meV is observed which allows these two materials to be combined to form a p-type TFET.

FIG. 5B illustrates a plot 520 with band diagrams of oxides and comparative semiconductors aligned according to their vacuum levels. It is pointed out that those elements of FIG. 5B having the same reference numbers (or names) as the elements of any other figure can operate or function in any manner similar to that described, but are not limited to such.

Here, on the x-axis, a number of semiconductors are listed according to their vacuum levels and their bandgap energies in eV are plotted on the y-axis. The top of each box representing the semiconductor oxide is the conduction band (CB) and the bottom of each box is the valance band (VB). The difference between CB and VB for each box is the work function for that semiconductor oxide. Comparing FIG. 5A and FIG. 5B for the same material combinations, different band offsets or broken gap configurations are obtained. For a manufactured heterojunction using the selected materials the actual band offsets and band alignments may be somewhere in-between the results in FIG. 5A and FIG. 5B. In most cases, the better guidance for the band offsets is given by the band alignments according to their charge neutrality level (CNL).

FIGS. 6A-H illustrate a manufacturing process flow when using oxide semiconductor materials to form a TFET, according to one embodiment of the disclosure. It is pointed out that those elements of FIGS. 6A-H having the same reference numbers (or names) as the elements of any other figure can operate or function in any manner similar to that described, but are not limited to such.

In one embodiment, n-Electrode (e.g., metal) is formed on a Substrate (e.g., Si Substrate). In one embodiment, highly doped n-type transparent semiconductor oxide material layer (e.g., $n^+$ doped $\beta$-$Ga_2O_3$) is formed over the n-Electrode. In one embodiment, a slightly doped n-type transparent semiconductor oxide material layer (e.g., $n^-$ doped $\beta$-$Ga_2O_3$) is formed over the highly doped transparent semiconductor oxide material layer (e.g., $n^+$ $\beta$-$Ga_2O_3$). In one embodiment, a highly doped p-type semiconductor material from the classic Group III-V, IV-IV, or IV (e.g., $p^+$ doped Ge) material is deposited over the slightly doped n-type transparent semiconductor oxide material layer (e.g., $n^-$ doped $\beta$-$Ga_2O_3$). In one embodiment, a photo-resist (PR) layer is deposited over the highly doped p-type semiconductor material. The manufacturing process is described with reference to the stack of layers 600 in FIG. 6A.

Figure 6A:
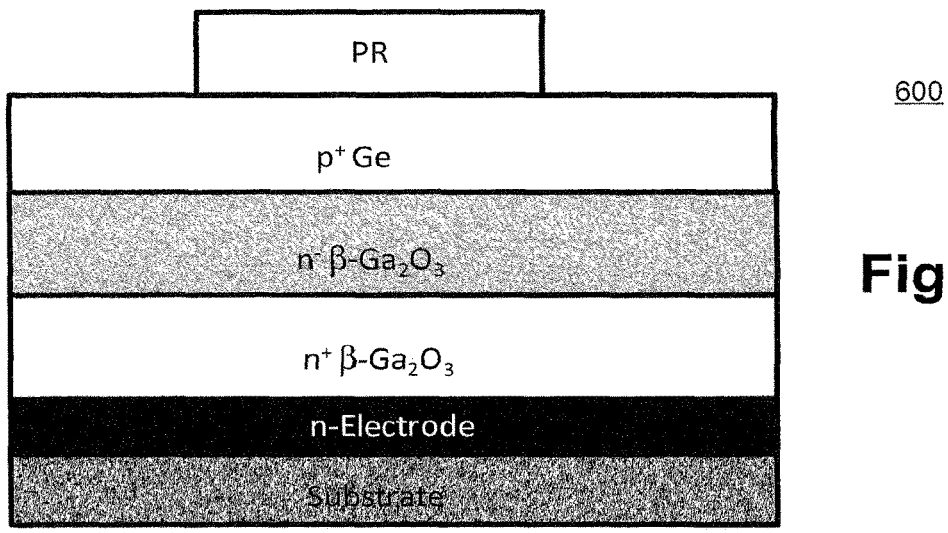
FIGS. 6A-H illustrate a manufacturing process flow when using oxide semiconductor materials to form a TFET, according to one embodiment of the disclosure.
Figure 6B:
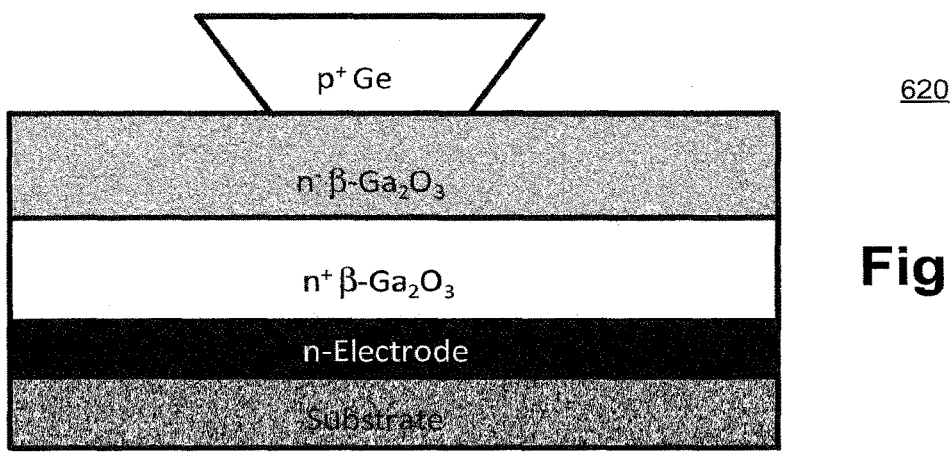

FIG. 6B illustrates process 620 when F-based (Fluorine based) ICP (Inductively Coupled Plasma) RIE (Reactive-ion etching) is applied to the photo-resist. This process is applied to remove the photo-resist layer and etch the highly doped p-type semiconductor material ($p^+$ doped Ge). The process of ICP-RIE stops at the lightly doped $n^-$ $\beta$-$Ga_2O_3$ transparent semiconductor oxide layer.

Figure 6C:
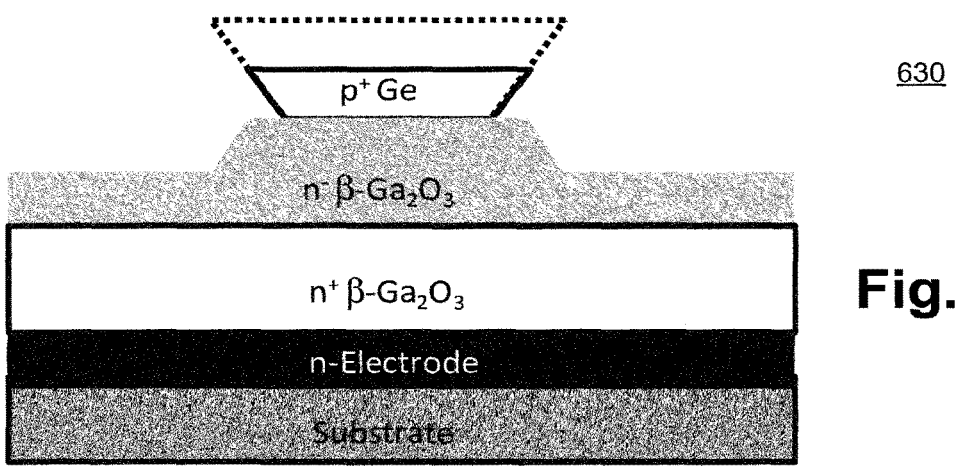
Figure 6D:
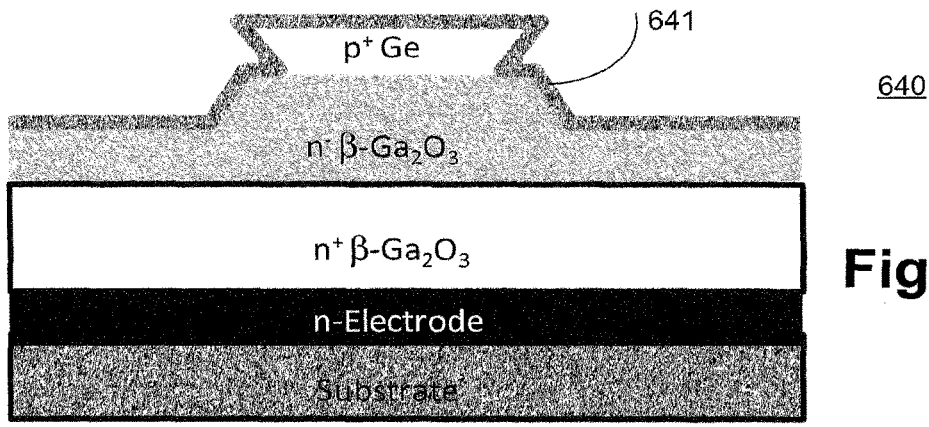

FIG. 6C illustrates process 630 in which $n^-$ $\beta$-$Ga_2O_3$ transparent semiconductor oxide layer is selectively etched. In one embodiment, Cl-based (Chlorine based) RIE process may be used for selectively etching layer of $n^-$ $\beta$-$Ga_2O_3$. In one embodiment, F-gas is used into the mix to slightly etch Ge. After the selective etching, a beveled etched wall is formed which is used for gate metal self alignment. FIG. 6D illustrates process 640 in which high-K gate dielectric material (e.g., ALD—atomic layer deposition) 641 is deposited over the beveled etched $n^-$ $\beta$-$Ga_2O_3$ and $p^+$ Ge.

Figure 6E:
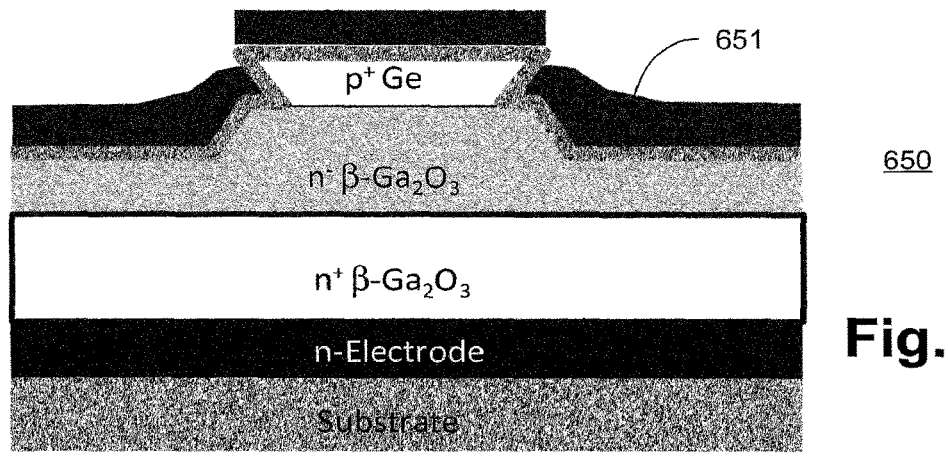
Figure 6F:
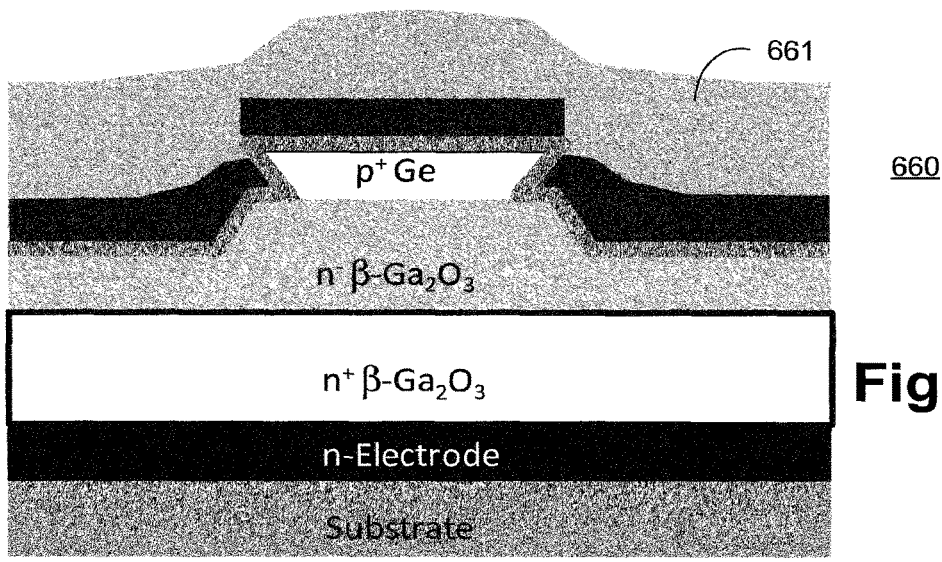
Figure 6G:
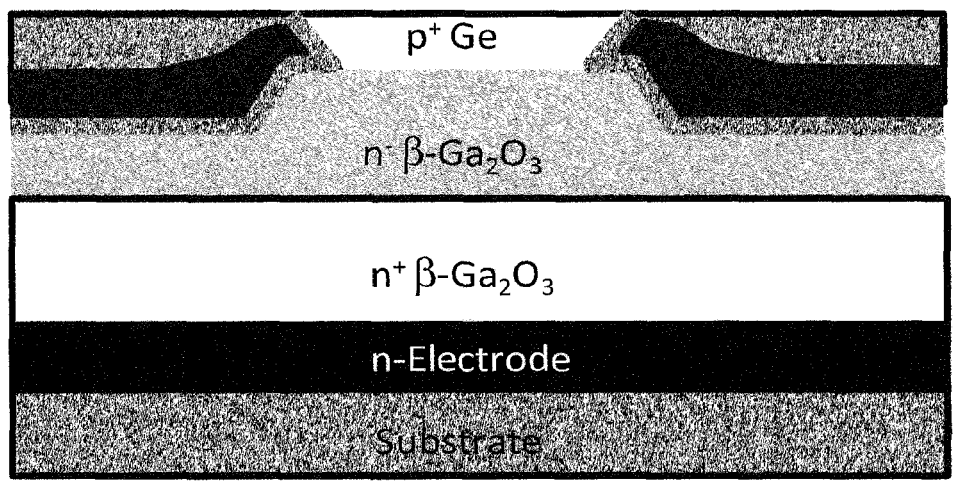
Figure 6H:
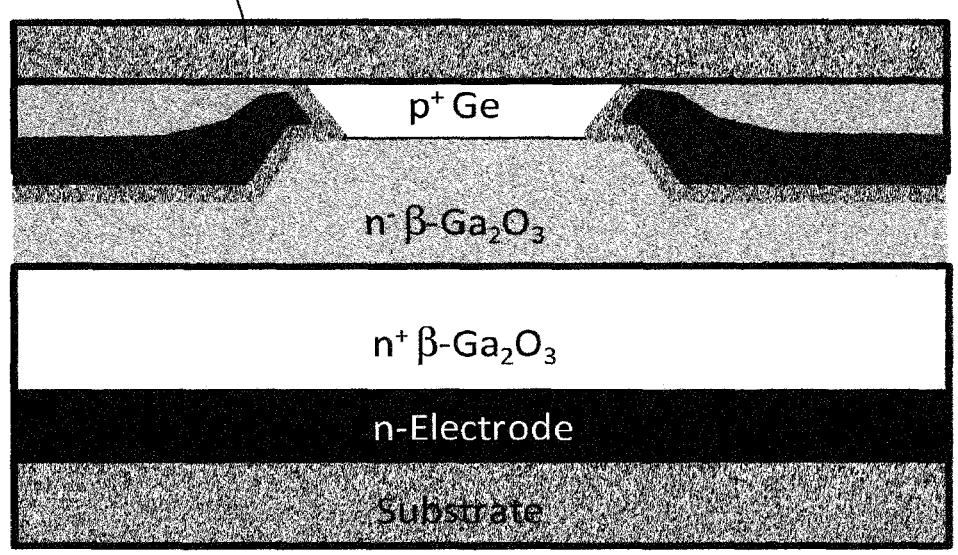

FIG. 6E illustrates process 650 in which gate metal 651 is deposited over layer 641 of high-K gate dielectric material. FIG. 6F illustrates process 660 in which low-K ILD 661 material is deposited over layer 651, where ILD is Inter Layer Dielectric which is a low-K material used for interconnect stack. FIG. 6G illustrates process 670 in which excess material over the layer of low-K ILD 661 material is removed i.e., planarized. FIG. 6H illustrates process 680 in which electrode 681 is formed by depositing metal over the planarized surface. In this example, a p-Electrode is formed. Not all processes are shown. For example, formation of vias and vertical connections for n-Electrodes. However, those processes can be performed using well known methods.

FIGS. 7A-H illustrate a manufacturing process flow when using organic semiconductor materials to form a TFET, according to one embodiment of the disclosure. It is pointed out that those elements of FIGS. 7A-H having the same reference numbers (or names) as the elements of any other figure can operate or function in any manner similar to that described, but are not limited to such.

Figure 7A:
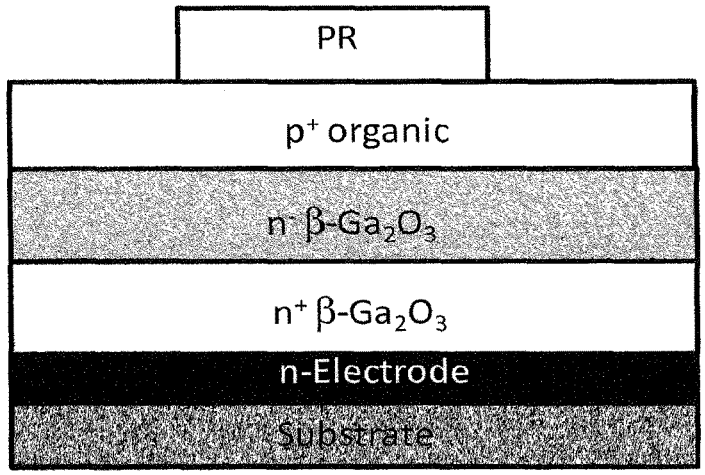
FIGS. 7A-H illustrate a manufacturing process flow when using organic semiconductor materials to form a TFET, according to one embodiment of the disclosure.

The manufacturing process is described with reference to the stack of layers 700 in FIG. 7A. These stack of layers 700 are as follows. In one embodiment, n-Electrode (e.g., metal) is formed on a Substrate (e.g., Si Substrate). In one embodiment, highly n-type doped transparent semiconductor oxide material layer (e.g., $n^+$ doped $\beta$-$Ga_2O_3$) is formed over the n-Electrode. In one embodiment, a slightly doped n-type transparent semiconductor oxide material layer (e.g., $n^-$ $\beta$-$Ga_2O_3$) is formed over the highly doped transparent semiconductor oxide material layer (e.g., $n^+$ $\beta$-$Ga_2O_3$). In one embodiment, a highly doped p-type organic semiconductor material (e.g., $p^+$ P3HT) is deposited over the slightly doped n-type transparent semiconductor oxide material layer (e.g., $n^-$ $\beta$-$Ga_2O_3$). In one embodiment, a photo-resist layer is deposited over the highly doped p-type semiconductor material.

Figure 7B:
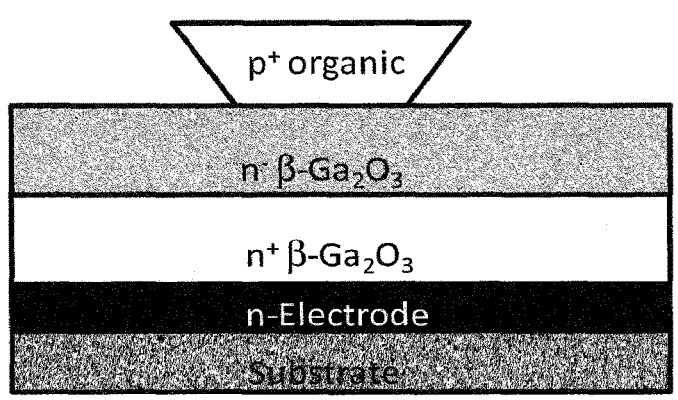

FIG. 7B illustrates process 720 when F-based ICP RIE is applied to the photo-resist. This process is applied to remove the photo-resist layer and etch the highly doped p-type organic semiconductor material (p$^+$ P3HT). The process of ICP-RIE stops at the lightly doped n$^-$ β-Ga$_2$O$_3$ transparent semiconductor oxide layer.

Figure 7C:
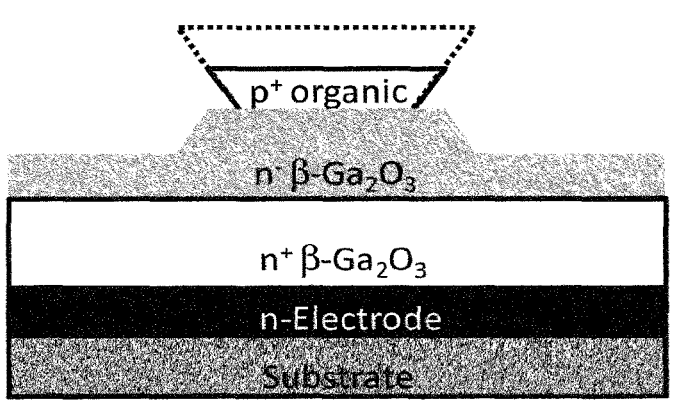
Figure 7D:
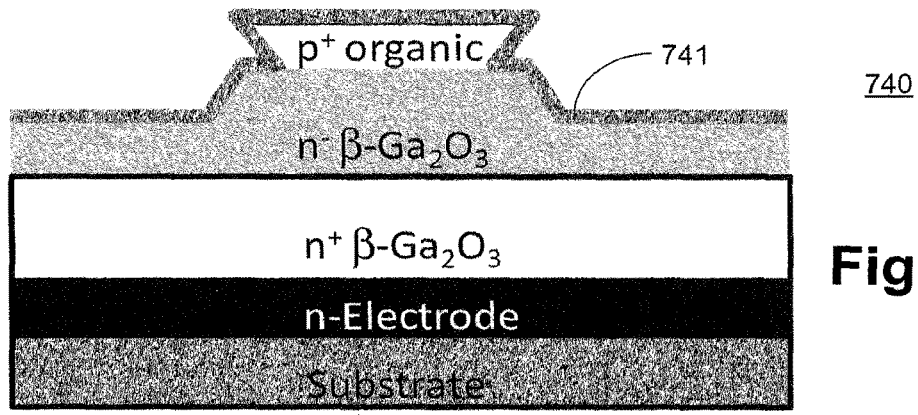
Figure 7E:
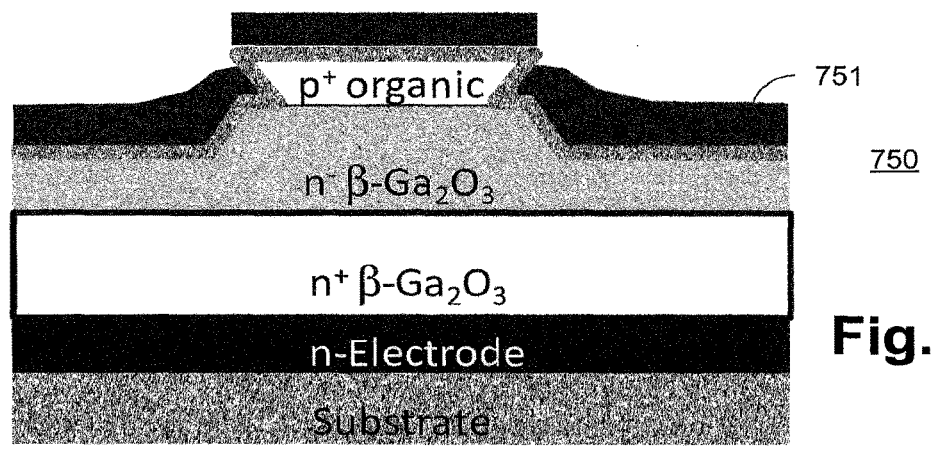
Figure 7F:
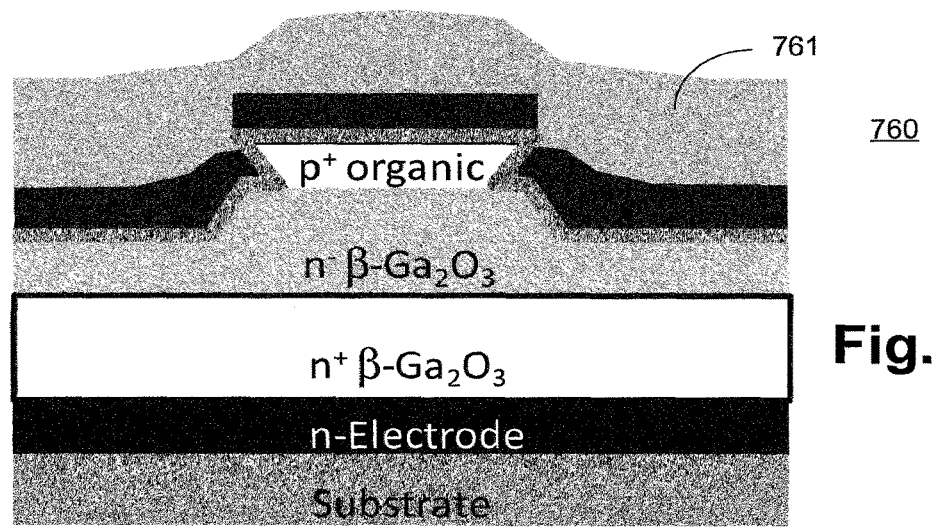
Figure 7G:
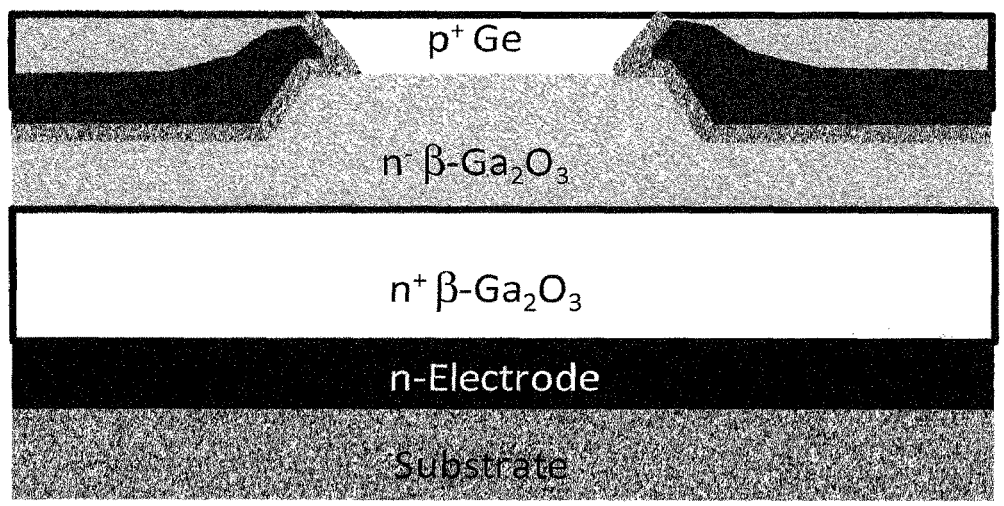
Figure 7H:
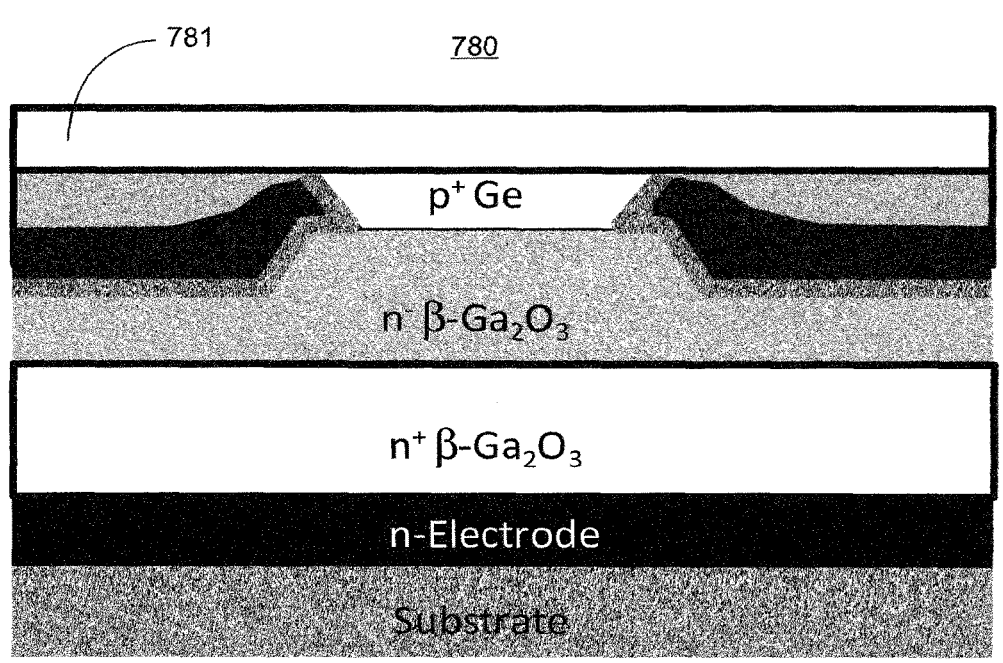

FIG. 7C illustrates process 730 in which n$^-$ β-Ga$_2$O$_3$ transparent semiconductor oxide layer is selectively etched. In one embodiment, Cl-based RIE process may be used for selectively etching layer of n$^-$ β-Ga$_2$O$_3$. In one embodiment, O$_2$-gas is used into the mix to slightly etch the p-type organic semiconductor (e.g., p$^+$ doped P3HT). After the selective etching, a beveled etched wall is formed which is used for gate metal self alignment. FIG. 7D illustrates process 740 in which high-K gate dielectric material (e.g., ALD—atomic layer deposition) 741 is deposited over the beveled etched n$^-$ β-Ga$_2$O$_3$ and p$^+$ P3HT. FIG. 7E illustrates process 750 in which gate metal 751 is deposited over layer 741 of high-K gate dielectric material. FIG. 7F illustrates process 760 in which low-K ILD 761 is deposited over layer 751. FIG. 7G illustrates process 770 in which excess material over the layer of low-K ILD 761 is removed i.e., planarized. FIG. 7H illustrates process 780 in which electrode 781 is formed by depositing metal over the planarized surface. In this example, a p-Electrode is formed. Not all processes are shown. For example, formation of vias and vertical connections for n-Electrodes. However, those processes can be performed using well known methods.

Figure 8:
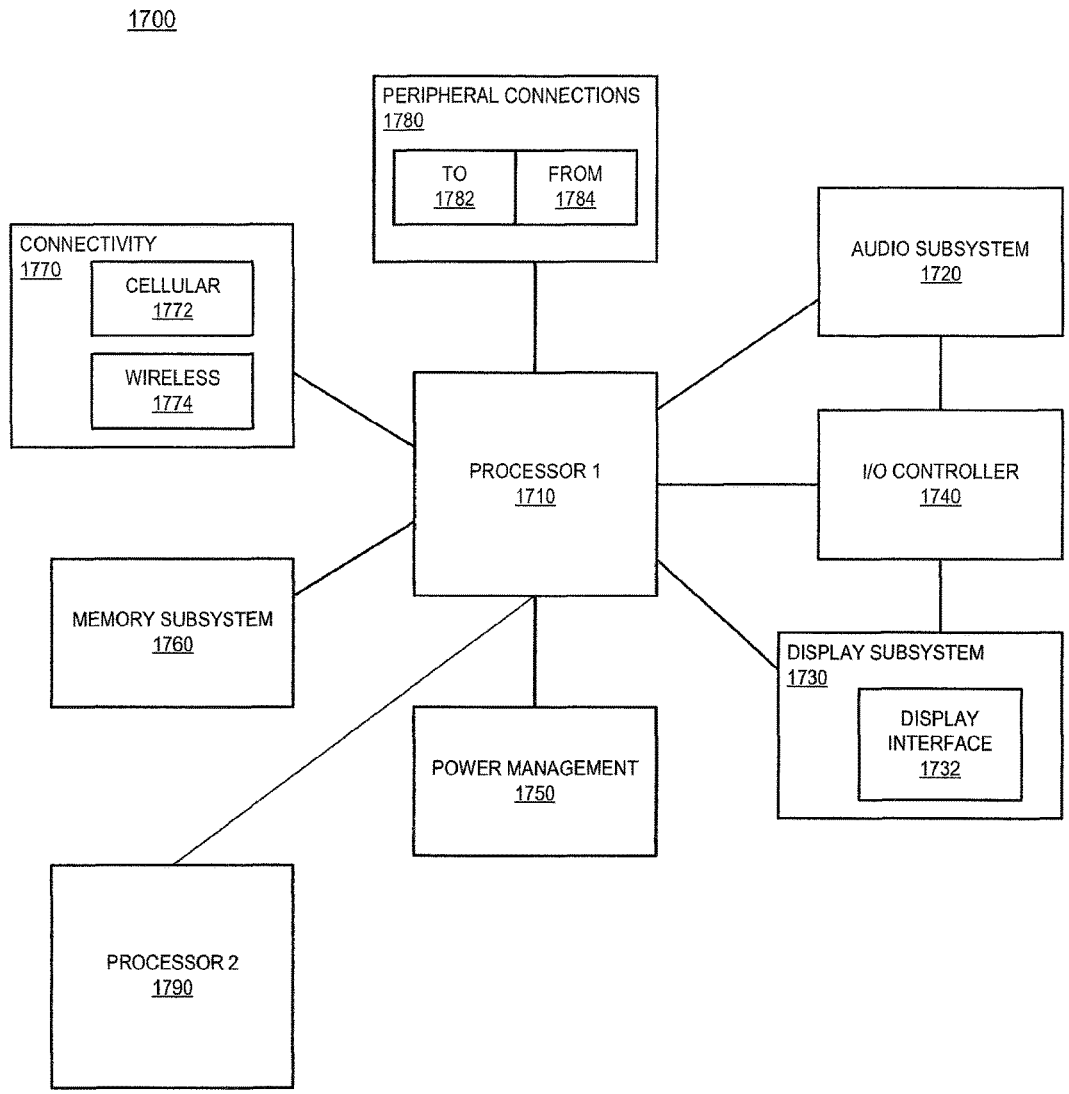
FIG. 8 is a smart device or a computer system or an SoC (System-on-Chip) with TFETs, according to one embodiment of the disclosure.

FIG. 8 is a smart device or a computer system or an SoC (System-on-Chip) with TFETs, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with TFETs described with reference to embodiments discussed. Other blocks of the computing device 1700 may also include TFETs described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a TFET is provided which comprises: a substrate; a doped first region, disposed above the substrate, having p-type material selected from a group consisting of Group III-V, IV-IV, and only IV of a periodic table; a doped second region, disposed above the substrate, having transparent or semi-transparent oxide n-type semiconductor material; and a gate stack coupled to the doped first and second regions.

In one embodiment, the transparent or semi-transparent oxide n-type semiconductor material is selected from a group consisting of $\alpha$-$Ga_2$—$O_3$, $\beta$-$Ga_2$—$O_3$, $In_2O_3$, and $SnO_2$. In one embodiment, the TFET is a FinFET, Tri-Gate, or square nano-wire based device. In one embodiment, the TFET further comprises a lightly doped n-type material coupled to the gate stack, the lightly doped n-type material separating the first and second doped regions from one another. In one embodiment, the TFET further comprises a lightly doped p-type material coupled to the gate stack, the lightly doped p-type material separating the first and second doped regions from one another. In one embodiment, the doped first region is a source region, and wherein the doped second region is a drain region.

In another example, a TFET is provided which comprises: a substrate; a doped first region, disposed above the substrate, having p-type organic semiconductor material; a doped second region, disposed above the substrate, having n-type transparent or semi-transparent oxide semiconductor material; and a gate stack coupled to the doped source and drain regions.

In one embodiment, the p-type organic semiconductor material is selected from a group consisting of P3HT, MDMO-PPV, PEFOT:PSS, CoPc, and CuPc. In one embodiment, the n-type transparent or semi-transparent oxide semiconductor material is selected from a group consisting of $\alpha$-Ga$_2$—O3, $\beta$-Ga$_2$—O$_3$, In$_2$O$_3$, and SnO$_2$. In one embodiment, the TFET is a FinFET, Tri-Gate, or square nano-wire based device. In one embodiment, the TFET further comprises a lightly doped n-type material coupled to the gate stack, the lightly doped n-type material separating the doped first and second regions from one another.

In one embodiment, the TFET further comprises a lightly doped p-type material coupled to the gate stack, the lightly doped p-type material separating the doped first and second regions from one another. In one embodiment, the lightly doped p-type material is undoped P3HT, or CuPc or CoPc material. In one embodiment, the doped first region is a source region, and wherein the doped second region is a drain region.

In another example, a TFET is provided which comprises: a substrate; a doped first region, disposed above the substrate, having p-type organic semiconductor material; a doped second region, disposed above the substrate, having n-type organic semiconductor material; and a gate stack coupled to the doped source and drain regions. In one embodiment, the p-type organic semiconductor material is selected from a group consisting of P3HT, MDMO-PPV, and PEDOT:PSS, CuPc, and CoPc.

In one embodiment, the n-type organic semiconductor material is one of F16CuPc or SnCl$_2$Pc. In one embodiment, the TFET is a FinFET, Tri-Gate, or square nano-wire based device. In one embodiment, the TFET further comprises a lightly doped n-type organic semiconductor material coupled to the gate stack, the lightly doped n-type material separating the doped first and second regions from one another. In one embodiment, the TFET further comprises a lightly doped p-type organic semiconductor material coupled to the gate stack, the lightly doped p-type material separating the doped first and second regions from one another. In one embodiment, the lightly doped p-type material is undoped PFHT material. In one embodiment, the doped first region is a source region, and wherein the doped second region is a drain region.

In another example, a system is provided which comprises a memory; a processor coupled to the memory, the processor having TFETs according to the TFETs discussed above of various embodiments; and a wireless antenna for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:
1. A tunneling field effect transistor (TFET), comprising:
a substrate;
a doped first region, disposed above the substrate, having p-type organic semiconductor material;
a doped second region, disposed above the substrate, having n-type transparent or semi-transparent oxide semiconductor material; and
a gate stack coupled to the doped first region and doped second region.
2. The TFET of claim 1, wherein the p-type organic semiconductor material is selected from a group consisting of P3HT, MDMO-PPV, PEDOT:PSS, CoPc, and CuPc.
3. The TFET of claim 1, wherein the n-type transparent or semi-transparent oxide semiconductor material is selected from a group consisting of $\alpha$-GaO$_3$, $\beta$-Ga$_2$O$_3$, In$_2$O$_3$, and SnO$_2$.
4. The TFET of claim 1, wherein the TFET is a FinFET, Tri-Gate, or square nano-wire based device.
5. The TFET of claim 1 further comprises a lightly doped n-type material coupled to the gate stack, the lightly doped n-type material separating the doped first and second regions from one another.
6. The TFET of claim 1 further comprises a lightly doped p-type material coupled to the gate stack, the lightly doped p-type material separating the doped first and second regions from one another.
7. The TFET of claim 6, wherein the lightly doped p-type material is undoped P3HT, or CuPc or CoPc material.

* * * * *